(12) United States Patent
Jeong

(10) Patent No.: US 9,412,908 B2
(45) Date of Patent: Aug. 9, 2016

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 563 days.

(21) Appl. No.: 13/548,822

(22) Filed: Jul. 13, 2012

(65) Prior Publication Data

US 2012/0280268 A1 Nov. 8, 2012

Related U.S. Application Data

(63) Continuation of application No. 12/618,422, filed on Nov. 13, 2009, now abandoned.

(30) Foreign Application Priority Data

Nov. 14, 2008 (KR) .................. 10-2008-0113227

(51) Int. Cl.
| | |
|---|---|
| H01L 33/00 | (2010.01) |
| H01L 33/40 | (2010.01) |
| H01L 33/62 | (2010.01) |
| H01L 33/38 | (2010.01) |

(52) U.S. Cl.
CPC ............ *H01L 33/405* (2013.01); *H01L 33/38* (2013.01); *H01L 33/62* (2013.01); *H01L 33/0079* (2013.01); *H01L 2924/0002* (2013.01)

(58) Field of Classification Search
CPC .......... H01L 33/30; H01L 33/40; H01L 33/38
USPC .............................. 257/98, E33.063, E33.065
See application file for complete search history.

(56) References Cited

U.S. PATENT DOCUMENTS

| | | | |
|---|---|---|---|
| 5,479,197 | A | 12/1995 | Fujikawa et al. |
| 5,545,903 | A | 8/1996 | van der Peol |
| 7,754,515 | B2 | 7/2010 | Shimizu et al. |
| 7,939,841 | B2 | 5/2011 | Lee et al. |
| 2003/0015721 | A1 | 1/2003 | Slater, Jr. et al. |
| 2003/0113581 | A1 | 6/2003 | Gotou |
| 2006/0145164 | A1 | 7/2006 | Illek et al. |
| 2006/0145174 | A1 | 7/2006 | Lee et al. |
| 2006/0154389 | A1 | 7/2006 | Doan |
| 2007/0012939 | A1 | 1/2007 | Hwang et al. |
| 2007/0114552 | A1 | 5/2007 | Jang et al. |

(Continued)

FOREIGN PATENT DOCUMENTS

| | | |
|---|---|---|
| CN | 1099906 A | 3/1995 |
| CN | 1788358 A | 6/2006 |

(Continued)

OTHER PUBLICATIONS

Machine translation of Lee KR20070094047.

*Primary Examiner* — Hsin-Yi Hsieh
(74) *Attorney, Agent, or Firm* — Birch, Stewart, Kolasch & Birch, LLP

(57) ABSTRACT

Disclosed are a semiconductor light emitting device. The semiconductor light emitting device includes a plurality of compound semiconductor layers including a first conductive semiconductor layer, an active layer and a second conductive semiconductor layer; a pad on the plurality of compound semiconductor layers; an electrode layer under the plurality of compound semiconductor layers; and a supporting member disposed under the plurality of compound semiconductor layers and corresponding to the pad.

20 Claims, 4 Drawing Sheets

(56) References Cited

U.S. PATENT DOCUMENTS

| | | |
|---|---|---|
| 2007/0228942 A1 | 10/2007 | Akai et al. |
| 2007/0263957 A1 | 11/2007 | Shimizu et al. |
| 2007/0278502 A1 | 12/2007 | Shakuda et al. |
| 2007/0295952 A1 | 12/2007 | Jang et al. |
| 2007/0295986 A1 | 12/2007 | Lee et al. |
| 2008/0001166 A1 | 1/2008 | Lee et al. |
| 2008/0035908 A1 | 2/2008 | Sakai |
| 2008/0035949 A1 | 2/2008 | Fudeta et al. |
| 2008/0067539 A1 | 3/2008 | Shakuda |
| 2008/0121907 A1 | 5/2008 | Wen et al. |
| 2008/0135859 A1* | 6/2008 | Cho et al. ................. 257/94 |
| 2008/0142809 A1 | 6/2008 | Jang et al. |
| 2008/0237622 A1 | 10/2008 | Choi et al. |
| 2010/0090237 A1 | 4/2010 | Jeong |
| 2010/0237371 A1* | 9/2010 | Kang et al. ................. 257/98 |

FOREIGN PATENT DOCUMENTS

| | | |
|---|---|---|
| JP | 2008-60279 A | 3/2008 |
| JP | 2008-60331 A | 3/2008 |
| KR | 10-2001-0023092 A | 3/2001 |
| KR | 10-0774198 B1 | 11/2007 |
| KR | 10-0865754 B1 | 10/2008 |

\* cited by examiner

SEMICONDUCTOR LIGHT EMITTING DEVICE

The present application is a continuation of application Ser. No. 12/618,422, filed Nov. 13, 2009 now abandoned, which claims priority under 35 U.S.C. 119 to Korean Patent Application No. 10-2008-0113227 (filed on Nov. 14, 2008), each of which is hereby incorporated by reference in its entirety.

BACKGROUND

The embodiment relates a semiconductor light emitting device.

Group III-V nitride semiconductors are spotlighted as core materials of light emitting diodes (LEDs) or laser diodes (LDs) due to physical and chemical characteristics. The group III-V nitride semiconductors mainly include semiconductor materials having a composition formula of $In_xAl_yGa_{1-x-y}N$ ($0 \leq x \leq 1$, $0 \leq y \leq 1$, $0 \leq x+y \leq 1$).

The LED is a kind of a semiconductor device, which transmits/receives signals by converting electricity into infrared rays or light using the characteristic of the compound semiconductor and is used as a light source.

The LED and LD employing such nitride semiconductors have been mainly used in light emitting devices to obtain light, and have been applied to various appliances (e.g., a light emitting part of a key pad of a portable phone, an electric bulletin board, an illumination device) as a light source.

SUMMARY

The embodiment provides a semiconductor light emitting device, which includes a shock protecting member provided at a position corresponding to that of a pad.

The embodiment provides a semiconductor light emitting device, which includes a shock supporting member provided on a plurality of compound semiconductor layers corresponding to a pad.

The embodiment provides a semiconductor light emitting device, which includes a shock supporting member provided on a plurality of compound semiconductor layers and a channel layer under a circumference portion of the compound semiconductor layers. An embodiment provides a semiconductor light emitting device comprising: a light emitting structure including a first conductive semiconductor layer, a second conductive semiconductor layer under the first conductive semiconductor layer and an active layer between the first and second semiconductor layers; an electrode on a first region of a top surface of the first conductive semiconductor layer; an electrode layer under a lower surface of the second conductive semiconductor layer; a conductive support member under the electrode layer; a channel layer between a peripheral portion of the lower surface of the second conductive semiconductor layer and the conductive support member; and a supporting member between the electrode layer and the conductive support member, wherein an first portion of the channel layer is physically contacted with the lower surface of the second conductive semiconductor layer and is spaced apart from the conductive support member, wherein the supporting member has a width smaller than that of the lower surface of the second conductive semiconductor layer, wherein the supporting member corresponds to the electrode.

An embodiment provides a semiconductor light emitting device comprising: A semiconductor light emitting device comprising: alight emitting structure including a first conductive semiconductor layer, a second conductive semiconductor layer under the first conductive semiconductor layer and an active layer between the first and second semiconductor layers; an electrode having a pad on a top surface of the first conductive semiconductor layer; an electrode layer having a reflective material under a lower surface of the second conductive semiconductor layer; a conductive support member under the electrode layer; a channel layer between a peripheral portion of the lower surface of the second conductive semiconductor layer and the conductive support member; and a supporting member between the electrode layer and the conductive support member, wherein an inner portion of the channel layer is physically contacted with the lower surface of the second conductive semiconductor layer and is spaced apart from the supporting member, wherein the supporting member has a width smaller than that of the lower surface of the second conductive semiconductor layer, wherein the supporting member corresponds to the pad of the electrode, wherein the electrode layer includes a first outer portion and a second outer portion opposite to the first outer portion, wherein the supporting member is disposed between the first outer portion and the second outer portion of the electrode layer.

The details of one or more embodiments are set forth in the accompanying drawings and the description below. Other features will be apparent from the description and drawings, and from the claims.

DETAILED DESCRIPTION OF THE EMBODIMENTS

Hereinafter, a semiconductor light emitting device according to the embodiments will be described with respect to accompanying drawings.

In the description about the embodiment, the size of elements shown in the accompanying drawings is for an illustrative purpose only, but the embodiment is not limited thereto.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Figure 1:
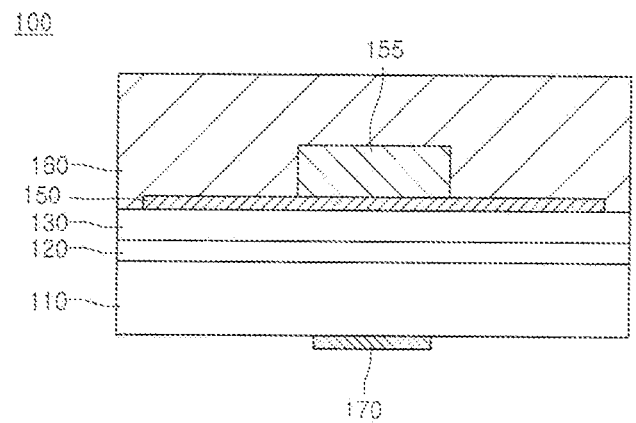
FIG. 1 is a side sectional view showing a semiconductor light emitting device according to a first embodiment.
Figure 2:
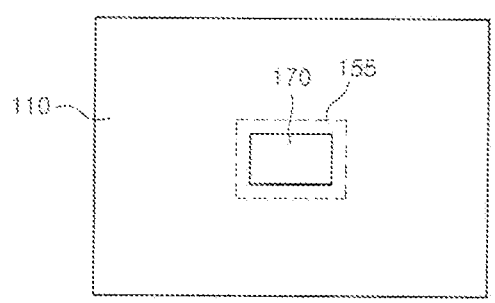
FIG. 2 is a bottom view of FIG. 1.

FIG. 1 is a sectional side view showing a semiconductor light emitting device 100 according to a first embodiment, and FIG. 2 is a bottom view of FIG. 1.

Referring to FIGS. 1 and 2, the semiconductor light emitting device 100 includes a first conductive semiconductor layer 110, an active layer 120, a second conductive semiconductor layer 130, an electrode layer 150, a shock supporting member 155, a conductive support member 160, and a pad 170.

The semiconductor light emitting device 100 includes a light emitting diode (LED) based on a plurality of compound semiconductors, for example, compound semiconductors of group III-V elements. The LED may be a color LED emitting blue, green or red light or an UV LED. The light emitted from the LED can be variously realized within the scope of the embodiment.

The compound semiconductor layers include the first conductive semiconductor layer 110, the active layer 120, and the second conductive semiconductor layer 130.

The first conductive semiconductor layer 110 may include GaN, AlN, AlGaN, InGaN, InN, InAlGaN, AlInN, AlGaAs, GaP, GaAs, GaAsP, or AlGaInP, which is a compound semiconductor of group III-V elements doped with a first conductive dopant. When the first conductive semiconductor is an N-type semiconductor, the first conductive dopant includes an N-type dopant such as Si, Ge, Sn, Se, or Te. The first conductive semiconductor layer 110 may include a single layer or a multi-layer, but the embodiment is not limited thereto.

The pad 170 is formed under the first conductive semiconductor layer 110. The pad 170 may have a predetermined shape and a predetermined pattern, but the embodiment is not limited thereto. The pad 170 may be disposed at the center of a lower portion of the first conductive semiconductor layer 110 to supply a current. The pad 170 may have a circular or polygonal shape. The pad 170 is connected to a first electrode (not shown) formed under the first conductive semiconductor layer 110, or the first electrode may be additionally provided for the first conductive semiconductor layer 110, but the embodiment is not limited thereto.

The pad 170 may be formed by using Ti, Al, In, Ta, Pd, Co, Ni, Si, Ge, Ag or Au, but the embodiment is not limited thereto.

The active layer 120 is formed on the first conductive semiconductor layer 110, and may have a single quantum well structure or a multi-quantum well structure. The active layer 120 may have the arrangement of a well layer and a barrier layer by using compound semiconductor materials of group III-V elements. For example, the active layer 120 may have the arrangement of an InGaN well layer/a GaN barrier layer. A conductive clad layer may be formed on and/or under the active layer 120, and may include an AlGaN-based semiconductor.

The second conductive semiconductor layer 130 is formed on the active layer 120. The second conductive semiconductor layer 130 may include GaN, AlN, AlGaN, InGaN, InN, InAlGaN, AlInN, AlGaAs, GaP, GaAs, GaAsP, or AlGaInP which is a compound semiconductor of III-V elements doped with a second conductive dopant. When the second conductive semiconductor is a P-type semiconductor, the second conductive dopant includes a P-type dopant such as Mg or Zn. The second conductive semiconductor layer 130 may have a single layer or a multi-layer, but the embodiment is not limited thereto.

The first conductive semiconductor layer 110, the active layer 120, and the second conductive semiconductor layer 130 may be defined as a light emitting structure.

The second conductive semiconductor layer 130 may be provided thereon with an N-type semiconductor layer or a P-type semiconductor layer. The first conductive semiconductor layer 110 may be realized as a P-type semiconductor layer, and the second conductive semiconductor layer 130 may be realized as an N-type semiconductor layer. Accordingly, the light emitting structure may include at least one of an N-P junction structure, a P-N junction structure, an N-P-N junction structure, and a P-N-P junction structure.

A layer or a plurality of patterns is formed between the second conductive semiconductor layer 130 and the electrode layer 150, so current distribution caused by resistance difference can be dispersed. The layer or the plurality of patterns includes at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, and RuOx.

The electrode layer 150 is formed on the second conductive semiconductor layer 130. The electrode layer 150 may comprise at least one of a reflective electrode layer, an ohmic-contact layer, and an adhesion layer. The electrode layer 150 may include at least one of metallic material and oxide material. The reflective electrode layer may includes at least one of Ag, Ni, Al, Rh, Pd, Ir, Ru, Mg, Zn, Pt, Au, Hf, or the selective combination of the above. The ohmic-contact layer may include at least one at least one selected from the group consisting of ITO(indium tin oxide), IZO(indium zinc oxide), IZTO(indium zinc tin oxide), IAZO(indium aluminum zinc oxide), IGZO(indium gallium zinc oxide), IGTO(indium gallium tin oxide), AZO (aluminum zinc oxide), ATO(antimony tin oxide), GZO(gallium zinc oxide), IrOx, RuOx, RuOx/ITO, Ni/IrOx/Au, and Ni/IrOx/Au/ITO, Pt, Ni, Au, Rh and Pd. The adhesion layer may include at least one of Ti, Au, Sn, Ni, Cr, Ga, In, Bi, Cu, Ag, and Ta. The electrode layer 150 may be formed of a seed metal.

An ohmic-contact layer (not shown) may be further formed between the electrode layer 150 and the second conductive semiconductor layer 130. The ohmic-contact layer may include a layer or a plurality of patterns. The ohmic-contact layer includes at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO, but the embodiment is not limited thereto.

The shock supporting member 155 having a predetermined size is formed on the electrode layer 150 corresponding to the pad 170.

The shock supporting member 155 may include a metallic material (e.g., W, Mo) having a high melting point, or a conductive metallic material having high strength. The shock supporting member 155 may have the minimum of thickness of about 1 um or more to enhance the strength thereof. For example, the shock supporting member 155 may have a thickness of about 1 um to about 10 um.

As shown in FIG. 2, the shock supporting member 155 may have the size greater than that of the pad 170. The shock supporting member 155 may have a size sufficient to absorb a shock transmitted from the pad 170.

If a plurality of pads 170 are employed, a plurality of shock supporting members 155 may be employed. The shock supporting member 155 minimizes the shock causing the semiconductor layers 110, 120, and 130 to be bent when the pad 170 is bonded. Accordingly, the breakage or the delamination of an LED chip causing the degradation of the chip characteristic can be prevented.

The conductive support member 160 may be formed on both the electrode layer 150 and the buffer member 155. The conductive support member 160 may serve as a base substrate. The conductive support member 160 may be realized by using Cu, Au, Ni, Mo, Cu—W, or a carrier wafer such as Si, Ge, GaAs, ZnO, SiC, SiGe and GaN. The conductive support member 160 may be formed through an electrolytic plating scheme or in the form of a sheet, but the embodiment is not limited thereto. The conductive support member 160 may have a thickness of about 30 um to about 150 um, but the embodiment is not limited thereto.

The conductive support member 160 makes contact with a peripheral portion of the second conductive semiconductor layer 130, or the electrode layer 150 may make contact with the second conductive semiconductor layer 130, but the embodiment is not limited thereto.

FIGS. 3 to 9 are views showing the manufacturing process of the semiconductor light emitting device of FIG. 1.

Figure 3:
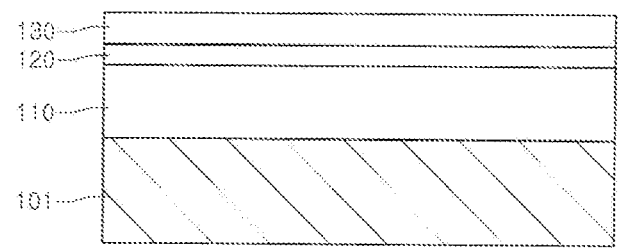
FIGS. 3 to 9 are views showing the manufacturing process of the semiconductor light emitting device of FIG. 1.

Referring to FIG. 3, the substrate 101 is loaded onto growth equipment, and a compound semiconductor layer of II to VI elements is formed on the substrate 101.

The grown equipment may include an e-beam evaporator, a physical vapor deposition (PVD) apparatus, a chemical vapor deposition (CVD) apparatus, a plasma laser deposition (PLD) apparatus, a dual-type thermal evaporator, a sputtering apparatus, or a metal organic chemical vapor deposition (MOCVD) apparatus, but the embodiment is not limited thereto.

The substrate 101 may include one selected from the group consisting of $Al_2O_3$, GaN, SiC, ZnO, Si, GaP, InP, $Ga_2O_3$, a conductive substrate, and GaAs. The substrate 101 may be provided on a top surface thereof with a concave-convex pattern.

In addition, the substrate 101 may be formed thereon with a layer or a pattern formed using a compound semiconductor of group II-VI elements. For example, the substrate 101 may be formed thereon with at least one of a ZnO layer (not shown), a buffer layer (not shown), and an undoped semiconductor layer (not shown). The buffer layer and the undoped semiconductor layer may be formed using compound semiconductors of III-V group elements. The buffer layer reduces a lattice constant difference from the substrate 101. The undoped semiconductor layer may be formed using an undoped GaN-based semiconductor.

The substrate 101 is formed thereon with the light emitting structure including the compound semiconductor layers. The light emitting structure includes the first conductive semiconductor layer 110, the active layer 120, and the second conductive semiconductor layer 130.

The first conductive semiconductor layer 110 is formed on the substrate 101, and the active layer 120 is formed on the first conductive semiconductor layer 110. The second conductive semiconductor layer 130 is formed on the active layer 120.

The first conductive semiconductor layer 110 may include GaN, AlN, AlGaN, InGaN, InN, InAlGaN, AlInN, AlGaAs, GaP, GaAs, GaAsP, or AlGaInP which is a compound semiconductor of group III-V elements doped with the first conductive dopant. When the first conductive semiconductor is an N-type semiconductor, the first conductive dopant includes an N-type dopant such as Si, Ge, Sn, Se, or Te. The first conductive semiconductor layer 110 may include a single layer or a multi-layer, but the embodiment is not limited thereto.

The active layer 120 is formed on the first conductive semiconductor layer 110, and may have a single quantum well structure or a multi-quantum well structure. The active layer 120 may have the arrangement of a well layer and a barrier layer using compound semiconductor materials of group III-V elements. For example, the active layer 120 may have the arrangement of an InGaN well layer/a GaN barrier layer.

A conductive clad layer may be formed on and/or under the active layer 120 and may include an AlGaN-based semiconductor.

The second conductive semiconductor layer 130 is formed on the active layer 120. The second conductive semiconductor layer 130 may include GaN, AlN, AlGaN, InGaN, InN, InAlGaN, AlInN, AlGaAs, GaP, GaAs, GaAsP, or AlGaInP which is a compound semiconductor of III-V group elements doped with a second conductive dopant. When the second conductive semiconductor is a P-type semiconductor, the second conductive dopant includes a P-type dopant such as Mg or Zn. The second conductive semiconductor layer 130 may have a single layer or a multi-layer, but the embodiment is not limited thereto.

The first conductive semiconductor layer 110, the active layer 120, and the second conductive semiconductor layer 130 may be defined as the light emitting structure 135. In addition, a third conductive semiconductor layer (e.g., an N-type semiconductor layer or a P-type semiconductor layer) may be formed on the second conductive semiconductor layer 130. Accordingly, the light emitting structure 135 may have at least one of an N-P junction structure, a P-N junction structure, an N-P-N junction structure, and a P-N-P junction structure.

Figure 4:
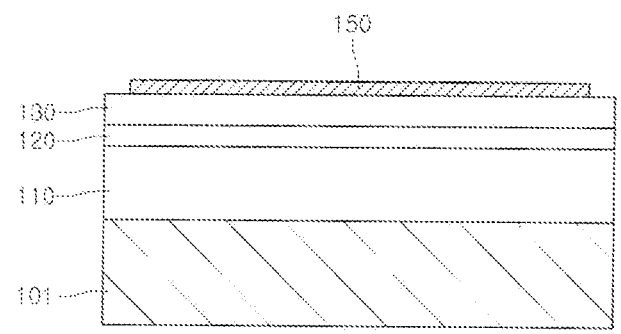

Referring to FIG. 4, the electrode layer 150 is formed on the second conductive semiconductor layer 130 or the third conductive semiconductor layer. The electrode layer 150 may be formed on a portion or the entire portion of the second conductive semiconductor layer 130 by using a sputtering apparatus. The electrode layer 150 may be formed by using at least one material including seed material, ohmic material, reflective material and adhesion material.

The electrode layer 150 may comprise at least one of a reflective electrode layer, an ohmic-contact layer, and an adhesion layer. The electrode layer 150 may include at least one of metallic material and oxide material. The reflective electrode layer may includes at least one of Ag, Ni, Al, Rh, Pd, Ir, Ru, Mg, Zn, Pt, Au, Hf, or the selective combination of the above. The ohmic-contact layer may include at least one at least one selected from the group consisting of ITO(indium tin oxide), IZO(indium zinc oxide), IZTO(indium zinc tin oxide), IAZO(indium aluminum zinc Oxide), IGZO(indium gallium zinc oxide), IGTO(indium gallium tin oxide), AZO (aluminum zinc oxide), ATO(antimony tin oxide), GZO(gallium zinc oxide), IrOx, RuOx, RuOx/ITO, Ni/IrOx/Au, and Ni/IrOx/Au/ITO, Pt, Ni, Au, Rh and Pd. The adhesion layer may include at least one of Ti, Au, Sn, Ni, Cr, Ga, In, Bi, Cu, Ag, and Ta. The electrode layer 150 may be formed of a seed metal.

A layer or a plurality of patterns is formed between the second conductive semiconductor layer 130 and the electrode layer 150, wherein the layer or the plurality of patterns includes at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, and RuOx.

An ohmic-contact layer (not shown) may be formed between the electrode layer 150 and the second conductive semiconductor layer 130. The ohmic-contact layer may include a layer or a plurality of patterns. The ohmic-contact layer includes at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO, but the embodiment is not limited thereto.

Figure 5:
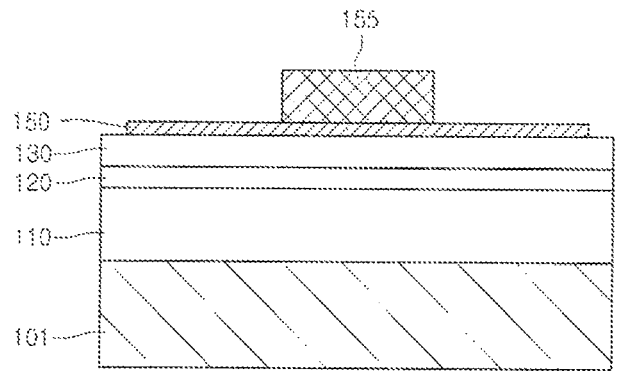
Figure 6:
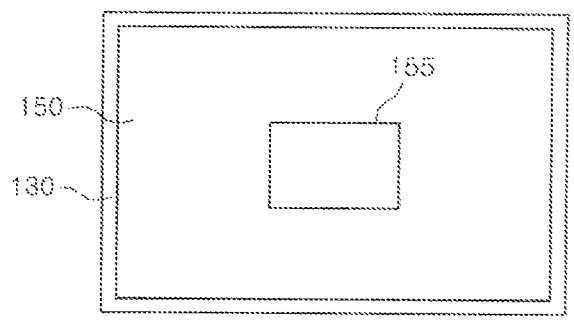

Referring to FIGS. 5 and 6, the shock supporting member 155 is formed on the electrode layer 150. The shock supporting member 155 is formed in a first area (not shown) opened by a mask pattern on the electrode layer 150. The first area has a size sufficient to cover an area for the pad 170.

The shock supporting member 155 may include a metallic material (e.g., W, Mo) having a high melting point, or a conductive metallic material having high strength. The shock supporting member 155 may have the minimum of thickness of about 1 um or more to enhance the strength thereof. For example, the shock supporting member 155 may have a thickness of about 1 um to about 10 um.

A single shock supporting member 155 or a plurality of shock supporting members 155 may be employed. The shock supporting member 155 may have a cylindrical shape or a polygonal column shape. The number or the shape of the sock absorbing members 155 depends on the number or the shape of the pads 170, but the embodiment is not limited thereto.

FIG. 6 is a plan view of FIG. 5. Although the shock supporting member 155 is formed in a polygonal shape at the central area of the electrode layer 150 as shown in FIG. 6, but the embodiment is not limited thereto.

Figure 7:
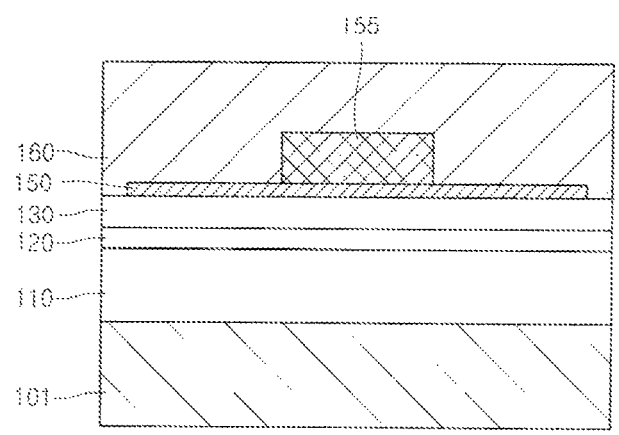
Figure 8:
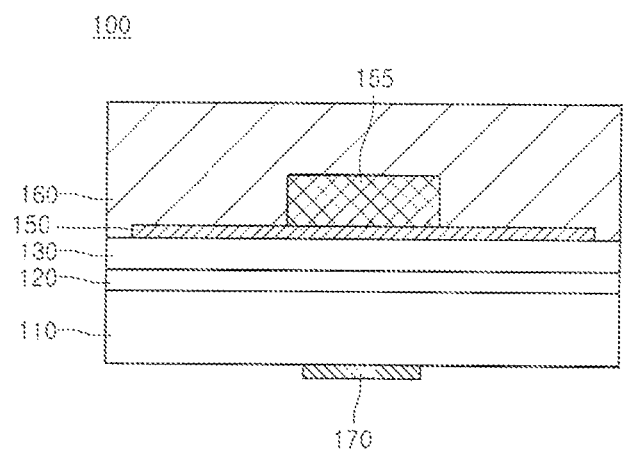

Referring to FIGS. 7 and 8, the conductive support member 160 may be formed on the electrode layer 150 and the shock supporting member 155. The conductive support member 160 may serve as a base substrate. The conductive support member 160 may be realized by using Cu, Au, Ni, Mo, Cu—W, or a carrier wafer such as Si, Ge, GaAs, ZnO, SiC, SiGe and GaN. The conductive support member 160 may be formed through an electrolytic plating scheme or in the form of a sheet, but the embodiment is not limited thereto. The conductive support member 160 may have a thickness of about 30 um to about 150 um, but the embodiment is not limited thereto.

After the conductive support member 160 has been formed, the conductive support member 160 is placed on a base. Thereafter, the substrate 101 is removed through a physical removing scheme and/or a chemical removing scheme.

The physical removing scheme is a laser lift off (LLO) scheme to separate the substrate 101 by irradiating a laser beam having a predetermined wavelength band to the substrate 101. The chemical scheme is to separate the substrate 101 by removing an additional semiconductor layer (e.g., buffer layer) using a wet etch solution when the additional semiconductor layer is formed between the substrate 101 and the first conductive semiconductor layer 110.

The surface of the first conductive semiconductor layer 110 having no substrate 101 may be etched through an inductively coupled plasma/reactive ion etching (ICP/RIE) scheme.

Figure 9:
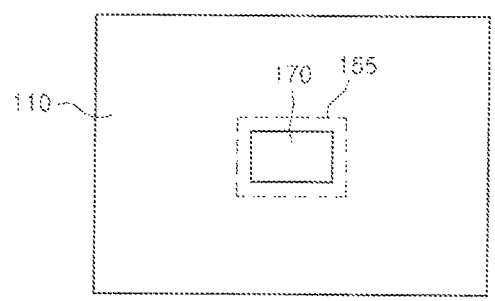

Referring to FIGS. 8 and 9, a mesa etching process is performed with respect to a boundary area (e.g., channel area) between chips to remove the boundary area such that the chips are separated from each other. The pad 170 is formed under the first conductive semiconductor layer 110.

For example, the pad 170 may be formed in an open area of a mask pattern using a sputtering apparatus. The pad 170 may include Ti, Al, In, Ta, Pd, Co, Ni, Si, Ge, Ag or Au, but the embodiment is not limited thereto.

The pad 170 may be formed before the mesa etching process is performed, after the mesa etching process is performed, or after the chips are separated from each other, but the embodiment is not limited thereto.

FIG. 9 is a bottom view of FIG. 8. Referring to FIG. 9, the pad 170 is formed in a position corresponding to the position of the first shock supporting member 155. The pad 170 may have a circular shape or a polygonal shape. The pad 170 may have the shape corresponding to that of the shock supporting member 155. For example, the pad 170 may have a polygonal shape, but the embodiment is not limited thereto.

The shock supporting member 155 absorbs a shock when the pad 170 is bonded, thereby preventing the semiconductor layers 110, 120, and 130 of the light emitting structure from being bent. Accordingly, the breakage or the delamination of an LED chip, which has been finished, causing the degradation of the chip characteristic can be prevented.

Figure 10:
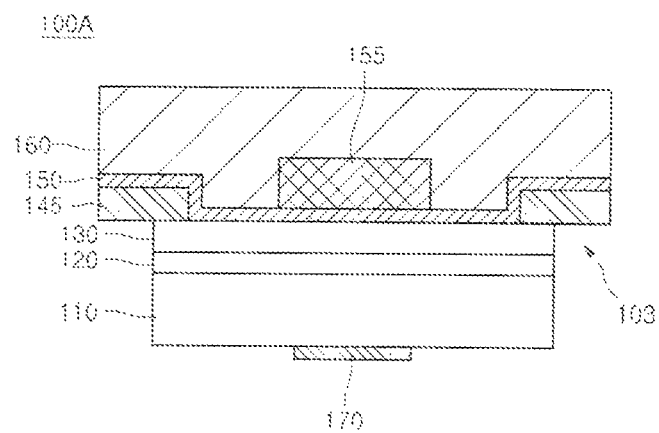
FIG. 10 is a sectional side view showing a semiconductor light emitting device according to a second embodiment.

FIG. 10 is a view showing a semiconductor light emitting device 100A according to a second embodiment. In the following description, the same reference numerals will be assigned to elements identical to those of the first embodiment, and details thereof will be omitted in order to avoid redundancy.

Referring to FIG. 10, the semiconductor light emitting device 100A includes the first conductive semiconductor layer 110, the active layer 120, the second conductive semiconductor layer 130, a channel layer 145, the electrode layer 150, the shock supporting member 155, the conductive support member 160, and the pad 170.

The channel layer 145 is formed at a peripheral portion of a top surface of the second conductive semiconductor layer 130. The channel layer 145 may have a continuous pattern shape such as a band shape, a ring shape, or a frame shape at the peripheral portion of the second conductive semiconductor layer 130 by using a mask pattern.

The electrode layer 150 is formed on both the channel layer 145 and the second conductive semiconductor layer 130, and the shock supporting member 155 is formed on the electrode layer 150.

The channel layer 145 may include a transparent insulating layer or a transparent conductive layer. The channel layer 145 may include a metallic oxide or a metallic nitride. The channel layer 145 may include one selected from the group consisting of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, RuOx, RuOx/ITO, Ni/IrOx/Au, and Ni/IrOx/Au/ITO.

The channel layer 145 may include not only the above transparent materials, but also a material transmitting a laser beam, or a material that hardly generate fragments by a laser beam. The channel layer 145 can improve the bonding strength with a material of the second conductive semiconductor layer 130. The channel layer 145 may have a width or a thickness of about 2 um or less, but the embodiment is not limited thereto.

The channel layer 145 and the electrode layer 150 may be used as one layer, that is, a conductive layer.

A recess 103 may surround a peripheral portion of the first conductive semiconductor layer 110, the active layer 120, and the second conductive semiconductor layer 130. The recess 103 may space the conductive support member 160 apart from the second conductive semiconductor layer 130.

An outer portion of the channel layer 145 is exposed to the recess 103 of the second conductive semiconductor layer 130. In other words, the outer portion of the channel layer 145 extends outward from a sidewall of the light emitting structure such that the channel layer 145 is exposed to the recess 103.

The channel layer 145 can prevent the lateral delamination of the light emitting structure caused by a laser beam irradiated during the manufacturing process. The channel layer 145 can prevent metallic fragments of the electrode layer 150 or the conductive support member 160 from being introduced into the outer portion of the light emitting structure. The channel layer 145 can prevent the moisture infiltration into the outer portion of the light emitting structure.

Figure 11:
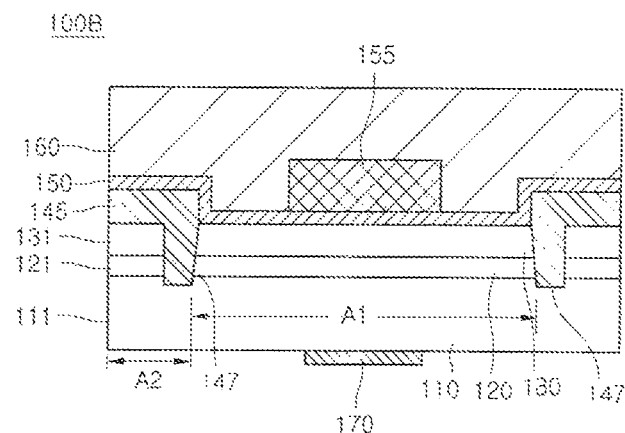
FIG. 11 is a sectional side view showing a semiconductor light emitting device according to a third embodiment.

FIG. 11 is a view showing a semiconductor light emitting device 100B according to a third embodiment. In the following description, the same reference numerals will be assigned to elements identical to those of the first embodiment, and details thereof will be omitted in order to avoid redundancy.

Referring to FIG. 11, the semiconductor light emitting device 100B includes the first conductive semiconductor layer 110, the active layer 120, the second conductive semiconductor layer 130, a channel layer 145 having a protrusion 147, the electrode layer 150, the shock supporting member 155, the conductive support member 160, and the pad 170.

The channel layer 145 surrounds a peripheral portion of the top surface of the second conductive semiconductor layer 130. The channel layer 145 may have a continuous pattern shape such as a band shape, a ring shape, or a frame shape at the peripheral portion of the second conductive semiconductor layer 130 using a mask pattern.

The electrode layer 150 is formed on both the channel layer 145 and the second conductive semiconductor layer 130. The shock supporting member 155 is formed on the electrode layer 150.

The channel layer 145 may include a transparent insulating layer. For example, the channel layer 145 may include at least one selected from the group consisting of $SiO_2$, $SiO_x$, $SiO_xN_y$, $Si_3N_4$, $Al_2O_3$, and $TiO_2$.

The protrusion 147 extends downward from an inside of the channel layer 145. The protrusion 147 may formed with a depth connecting to a portion of the first conductive semiconductor layer 110.

The protrusion 147 of the channel layer 145 may have a continuous pattern shape such as a ring shape or a band shape. The protrusion 147 may be formed within the range of about 1 to about 5 um from the sidewall of the semiconductor layers 110, 120, and 130.

The protrusion 147 of the channel layer 145 may be divided into an active area A1 and a non-active area A2. The semiconductor layers 110, 120, and 130 provided in the active area A1 are normally operated, and semiconductor layers 111, 121, and 131 provided in the non-active area A2 are abnormally operated. The first conductive semiconductor layer 111 provided in the non-active area A2 may be partially used as a current path.

The protrusion 147 of the channel layer 145 deactivates the left side of a chip. Accordingly, even if the semiconductor layers 111, 121, and 131 provided at the left side of the chip are shorted, the active area A1 is normally operated. The protrusion 147 of the channel layer 145 can prevent moisture from being infiltrated into the outer portion the chip.

The protrusion 147 of the channel layer 145 can enhance the bonding strength with the semiconductor layers 110, 120, and 130.

Figure 12:
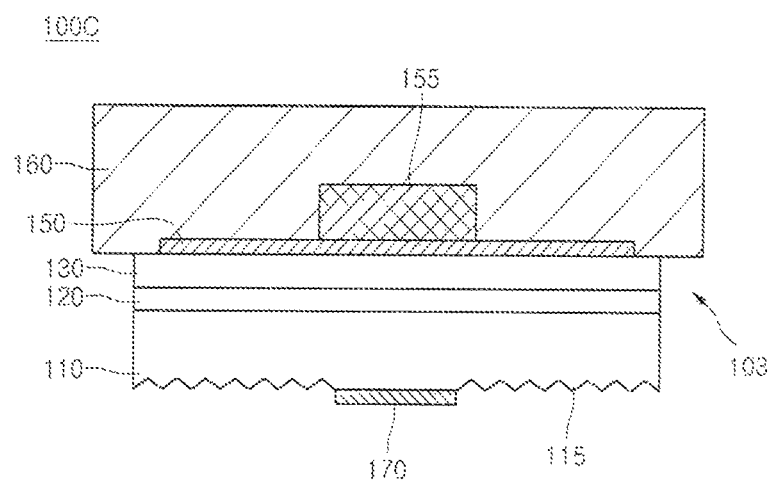
FIG. 12 is a sectional side view showing a semiconductor light emitting device according to a fourth embodiment.

FIG. 12 is a view showing a semiconductor light emitting device 100C according to a fourth embodiment. In the following description, the same reference numerals will be assigned to elements identical to those of the first and second embodiments, and details thereof will be omitted in order to avoid redundancy.

Referring to FIG. 12, the semiconductor light emitting device 100C has a structure in which the first conductive semiconductor layer 110 is formed on a bottom surface thereof with a roughness 115.

A method for manufacturing a semiconductor light emitting device, the method comprising: forming a light emitting structure including a first conductive semiconductor layer, an active layer, and a second conductive semiconductor layer; forming an electrode layer on the second conductive semiconductor layer; forming a shock supporting member in a first area of the electrode layer; and forming a pad under the first conductive semiconductor layer corresponding to the first area:

According to the embodiment, the semiconductor layers can be protected from a shock caused by bonding. The characteristic of an LED chip can be prevented from being degraded due to the shock caused by bonding. The bonding strength between the semiconductor layers and another layer can be improved.

According to the embodiment, inter-layer short can be prevented between the compound semiconductor layers. The compound semiconductor layers are prevented from being shorted due to the moisture infiltrated into the compound semiconductor layers. The semiconductor light emitting device can be reliably operated.

The embodiments can provide a semiconductor light emitting device such as an LED. The light efficiency of a vertical-type semiconductor light emitting device can be improved.

According to the embodiment, a light source, to which the semiconductor light emitting device is packaged, can be applied to various fields such as illumination, indictors, and displays.

Although the exemplary embodiments of the present invention have been described, it is understood that the present invention should not be limited to these exemplary embodiments but various changes and modifications can be made by one ordinarily skilled in the art within the spirit and scope of the present invention as hereinafter claimed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a light emitting structure including a first conductive semiconductor layer, a second conductive semiconductor layer under the first conductive semiconductor layer and an active layer between the first conductive semiconductor layer and the second conductive semiconductor layer;
   an electrode disposed on a region of a top surface of the first conductive semiconductor layer;
   an electrode layer disposed under a lower surface of the second conductive semiconductor layer;
   a conductive support member disposed under the electrode layer;
   a channel layer between a peripheral portion of the lower surface of the second conductive semiconductor layer and the conductive support member; and
   a supporting member disposed within a region between the electrode layer and the conductive support member,
   wherein a first portion of the channel layer is physically contacted with the lower surface of the second conductive semiconductor layer and is spaced apart from the supporting member,
   wherein an entire bottom surface of the supporting member has a width smaller than a width of the lower surface of the second conductive semiconductor layer, wherein the conductive support member includes a first region overlapped vertically with the supporting member and the electrode in a vertical direction perpendicular to the top surface of the first conductive semiconductor layer, wherein the conductive support member includes a second region overlapped vertically with the channel layer, wherein the first region of the conductive support member has a thickness thinner than a thickness of the second region of the conductive support member in the vertical direction, wherein the channel layer includes an opening region therein, wherein the electrode layer, an upper portion of the supporting member and a top region of the conductive support member are disposed in the opening region of the channel layer, wherein the top region of the conductive support member is protruded toward the electrode from the second region, wherein the top region of the conductive support member has a concave recess downwardly from a top surface of the top region of the conductive support member, wherein the concave recess is vertically overlapped with the center of the electrode in the vertical direction, wherein the support member is disposed in the concave recess, and wherein a width of the support member is smaller than a width of the electrode layer along a direction parallel to the top surface of the first conductive semiconductor layer.

2. The semiconductor light emitting device of claim 1, wherein an outer portion of the electrode layer is disposed between a lower surface of the channel layer and a top surface of the second region of the conductive support member.

3. The semiconductor light emitting device of claim 1, wherein the supporting member is formed of a conductive material different from the conductive support member.

4. The semiconductor light emitting device of claim 1, wherein the supporting member has a metal material different from the conductive support member and the electrode layer.

5. The semiconductor light emitting device of claim 1, wherein the supporting member has a metallic material.

6. The semiconductor light emitting device of claim 4, wherein the supporting member includes at least one of W and Mo.

7. The semiconductor light emitting device of claim 4, wherein a top surface of the supporting member in the concave recess has a size wider than a size of a lower surface of the electrode.

8. The semiconductor light emitting device of claim 4, wherein the conductive support member has a thickness thicker than a thickness of the supporting member, and
wherein a thickness of the supporting member is thicker than a thickness of the channel layer in the vertical direction.

9. The semiconductor light emitting device of claim 8, wherein the thickness of the supporting member ranges from 1 µm to 10 µm, and
wherein the thickness of the conductive support member ranges from 30 µm to 150 µm.

10. The semiconductor light emitting device of claim 2, wherein a second portion of the channel layer is physically contacted with a top surface of the outer portion of the electrode layer, and
wherein the top surface of the top region of the conductive support member contacts a bottom surface of the electrode layer in the opening region of the channel layer.

11. The semiconductor light emitting device of claim 10, wherein the channel layer is formed of a metallic oxide.

12. The semiconductor light emitting device of claim 10, wherein the channel layer is formed of an electrically conductive layer.

13. The semiconductor light emitting device of claim 11, wherein first and second outer portions of the channel layer are located at a lower position than an entire region of a bottom surface of the light emitting structure, and
wherein a thickness of the supporting member in the concave recess is thicker than a thickness of the channel layer in the vertical direction.

14. A semiconductor light emitting device comprising:
a light emitting structure including a first conductive semiconductor layer, a second conductive semiconductor layer under the first conductive semiconductor layer and an active layer between the first conductive semiconductor layer and the second conductive semiconductor layer;
an electrode having a pad disposed on a top surface of the first conductive semiconductor layer;
an electrode layer having a reflective material disposed under a lower surface of the second conductive semiconductor layer;
a conductive support member disposed under the electrode layer;
a channel layer between a peripheral portion of the lower surface of the second conductive semiconductor layer and the conductive support member; and
a supporting member disposed within a region between the electrode layer and the conductive support member,
wherein an outer portion of the conductive support member is located at a lower position than the lower surface of the second conductive semiconductor layer,
wherein a bottom surface of the supporting member has a width smaller than a width of the lower surface of the second conductive semiconductor layer,
wherein the supporting member has a different metal material from the conductive support member,
wherein the channel layer includes an opening region therein,
wherein an upper portion of the supporting member is disposed in the opening region of the channel layer,
wherein a top region of the conductive support member is disposed around the supporting member and is disposed in the opening region of the channel layer,
wherein the top region of the conductive support member is protruded toward the electrode from a second region of the conductive support member overlapped vertically with the channel layer,
wherein the top region of the conductive support member has a concave recess downwardly from a top surface of the top region of the conductive support member,
wherein the concave recess is vertically overlapped with the center of the electrode in a vertical direction perpendicular to the top surface of the first conductive semiconductor layer,
wherein the support member is disposed in the concave recess, and wherein a width of the support member is smaller than a width of the electrode layer along a direction parallel to the top surface of the first conductive semiconductor layer.

15. The semiconductor light emitting device of claim 14, wherein a thickness of the supporting member in the concave recess is thicker than a thickness of the channel layer in a vertical direction.

16. The semiconductor light emitting device of claim 15, wherein outer lateral surfaces of the supporting member are disposed in the opening region of the channel layer and the outer lateral surfaces of the supporting member contact the top region of the conductive support member, and wherein the top surface of the top region of the conductive support member and a top surface of the support member are disposed on the same horizontal plane.

17. A semiconductor light emitting device comprising:

a light emitting structure including a first conductive semiconductor layer, a second conductive semiconductor layer under the first conductive semiconductor layer and an active layer between the first conductive semiconductor layer and the second conductive semiconductor layer;

an electrode disposed on a region of a top surface of the first conductive semiconductor layer;

an electrode layer disposed under a lower surface of the second conductive semiconductor layer and including a reflective electrode layer;

a conductive support member disposed under the electrode layer;

a channel layer between a peripheral portion of the lower surface of the second conductive semiconductor layer and the conductive support member; and a supporting member disposed within a region between the electrode layer and the conductive support member, wherein a first portion of the channel layer is physically contacted with the lower surface of the second conductive semiconductor layer and is spaced apart from the supporting member, wherein a bottom surface of the supporting member has a width smaller than a width of the lower surface of the second conductive semiconductor layer, wherein the supporting member is vertically overlapped with a region of the electrode in a vertical direction perpendicular to the top surface of the first conductive semiconductor layer and has a thickness thicker than a thickness of the channel layer in the vertical direction, wherein the conductive support member includes a first region overlapped vertically with the supporting member and the electrode, wherein the conductive support member includes a second region overlapped vertically with the channel layer, wherein the first region of the conductive support member has a thickness thinner than a thickness of the second region of the conductive support member in the vertical direction, wherein the channel layer includes an opening region therein, wherein the electrode layer, an upper portion of the supporting member and a top region of the conductive support member are disposed in the opening region of the channel layer, wherein the top region of the conductive support member is protruded toward the electrode from the second region, wherein the top region of the conductive support member has a concave recess downwardly from a top surface of the top region of the conductive support member, wherein the concave recess is vertically overlapped with the center of the electrode in the vertical direction, wherein the support member is disposed in the concave recess, and where in a width of the support member is smaller than a width of the electrode layer along a direction parallel to the top surface of the first conductive semiconductor layer.

18. The semiconductor light emitting device of claim 17, wherein outer lateral surfaces of the supporting member contact the top region of the conductive support member.

19. The semiconductor light emitting device of claim 17, wherein the top surface of the top portion of the conductive support member and a top surface of the support member are physically contacted with a bottom surface of the electrode layer.

20. The semiconductor light emitting device of claim 1, wherein the top surface of the top portion of the conductive support member and a top surface of the support member are physically contacted with the electrode layer.

* * * * *